(12) United States Patent
Li et al.

(10) Patent No.: US 11,605,239 B2
(45) Date of Patent: Mar. 14, 2023

(54) FINGERPRINT RECOGNITION SENSOR AND MANUFACTURING METHOD THEREOF, AND DISPLAY DEVICE

(71) Applicant: BOE TECHNOLOGY GROUP CO., LTD., Beijing (CN)

(72) Inventors: Shipei Li, Beijing (CN); Ying Zhao, Beijing (CN); Renquan Gu, Beijing (CN); Wei He, Beijing (CN); Huili Wu, Beijing (CN); Dongsheng Yin, Beijing (CN); Sheng Xu, Beijing (CN); Lizhen Zhang, Beijing (CN); Xuefei Zhao, Beijing (CN); Fang He, Beijing (CN); Yupeng Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 208 days.

(21) Appl. No.: 17/041,516

(22) PCT Filed: Apr. 8, 2020

(86) PCT No.: PCT/CN2020/083760
§ 371 (c)(1),
(2) Date: Sep. 25, 2020

(87) PCT Pub. No.: WO2020/207408
PCT Pub. Date: Oct. 15, 2020

(65) Prior Publication Data
US 2021/0158007 A1    May 27, 2021

(30) Foreign Application Priority Data
Apr. 9, 2019    (CN) .......................... 201910282112.3

(51) Int. Cl.
*G06V 40/13*    (2022.01)
*H01L 27/146*    (2006.01)

(52) U.S. Cl.
CPC ...... *G06V 40/1318* (2022.01); *H01L 27/1461* (2013.01); *H01L 27/14612* (2013.01); *H01L 27/14638* (2013.01); *H01L 27/14683* (2013.01)

(58) Field of Classification Search
CPC ......... H01L 27/14683; H01L 27/14638; H01L 27/14612; G06V 40/13; G06V 40/1318
See application file for complete search history.

(56) References Cited

U.S. PATENT DOCUMENTS 10,489,628 B2 * 11/2019 Liu .................. H01L 27/14692
10,804,341 B2    10/2020 Liu et al.
(Continued)

FOREIGN PATENT DOCUMENTS

CN    105095872 A    11/2015
CN    105975963 A    9/2016
(Continued)

OTHER PUBLICATIONS

First Official Action issued in Chinese Patent Application No. 201910282112.3.
(Continued)

*Primary Examiner* — John R Lee
(74) *Attorney, Agent, or Firm* — Chiwin Law LLC

(57) ABSTRACT

Disclosed are a fingerprint recognition sensor, a manufacturing method, and a display device. The fingerprint recognition sensor includes a base substrate, a thin film transistor, on a side of the base substrate; and a photosensitive element, on a side of the base substrate away from the thin film transistor, the thin film transistor, the base substrate, and the photosensitive element are sequentially stacked in a thickness direction perpendicular to the base substrate, the base substrate includes a conductive structure penetrating through the base substrate in the thickness direction perpen-
(Continued)

dicular to the base substrate, and the photosensitive element is connected with the thin film transistor through the conductive structure.

19 Claims, 7 Drawing Sheets

(56) References Cited

U.S. PATENT DOCUMENTS

| | | | |
|---|---|---|---|
| 10,886,310 B2 | 1/2021 | Guo et al. | |
| 2017/0161541 A1 | 6/2017 | Li et al. | |
| 2018/0068166 A1 | 3/2018 | Zeng et al. | |
| 2018/0285617 A1* | 10/2018 | Liu | H01L 27/14685 |
| 2018/0307088 A1 | 10/2018 | Liu et al. | |
| 2018/0307887 A1 | 10/2018 | Han et al. | |
| 2019/0198543 A1* | 6/2019 | Guo | H01L 27/14647 |
| 2021/0158007 A1* | 5/2021 | Li | H01L 27/14683 |

FOREIGN PATENT DOCUMENTS

| | | |
|---|---|---|
| CN | 106055162 A | 10/2016 |
| CN | 106129069 A | 11/2016 |
| CN | 106684202 A | 5/2017 |
| CN | 107065274 A | 8/2017 |
| CN | 107248518 A | 10/2017 |
| CN | 108987455 A | 12/2018 |
| CN | 109994498 A | 7/2019 |

OTHER PUBLICATIONS

Search Report issued with the First Official Action in Chinese Patent Application No. 201910282112.3.

* cited by examiner

FINGERPRINT RECOGNITION SENSOR AND MANUFACTURING METHOD THEREOF, AND DISPLAY DEVICE

This application is a U.S. National Phase Entry of International Application No. PCT/CN2020/083760 filed on Apr. 8, 2020, designating the United States of America and claiming priority to Chinese Patent Application No. 201910282112.3, filed on Apr. 9, 2019. The present application claims priority to and the benefit of the above-identified applications and the above-identified applications are incorporated by reference herein in their entirety.

TECHNICAL FIELD

Embodiments of the present disclosure relate to a fingerprint recognition sensor, a manufacturing method thereof, and a display device.

BACKGROUND

At present, there are more and more electronic apparatuses equipped with OLED (Organic Light Emitting Diode) display devices, and users also put forward higher requirements for the safety performance of electronic apparatuses. Therefore, security verification functions, such as fingerprint recognition, etc., are increasingly integrated into the OLED display devices.

SUMMARY

Embodiments of the present disclosure provide a fingerprint recognition sensor, a manufacturing method thereof, and a display device, so as to solve the problem that the effective photosensitive area of the fingerprint recognition sensor is relatively small and the accuracy of fingerprint recognition is relatively small caused by the relatively small arrangement space of the photosensitive element because the photosensitive element and the thin film transistor in the fingerprint recognition sensor are disposed adjacently.

At least one embodiment of the present disclosure provides a fingerprint recognition sensor, which includes: a base substrate; a thin film transistor, on a side of the base substrate; and a photosensitive element, on a side of the base substrate away from the thin film transistor, the thin film transistor, the base substrate, and the photosensitive element are sequentially stacked in a thickness direction perpendicular to the base substrate, the base substrate includes a conductive structure penetrating through the base substrate in the thickness direction perpendicular to the base substrate, and the photosensitive element is connected with the thin film transistor through the conductive structure.

For example, in the fingerprint recognition sensor provided by an embodiment of the present disclosure, the conductive structure includes a first conductive sub-structure and a second conductive sub-structure which are separated, and both the first conductive sub-structure and the second conductive sub-structure penetrate through the base substrate in the thickness direction of the base substrate; and the photosensitive element includes: a first electrode on a first surface of the base substrate; a photosensitive layer on a side of the first electrode away from the base substrate; and a second electrode on a side of the photosensitive layer away from the first electrode, wherein the first electrode is connected with the first conductive sub-structure, and the second electrode is configured to be electrically connected with the second conductive sub-structure.

For example, in the fingerprint recognition sensor provided by an embodiment of the present disclosure, the photosensitive element includes the photosensitive layer, the thin film transistor includes an active layer, and an orthographic projection of the photosensitive layer on the base substrate overlaps with an orthographic projection of the active layer on the base substrate.

For example, in the fingerprint recognition sensor provided by an embodiment of the present disclosure, the orthographic projection of the photosensitive layer on the base substrate covers the orthographic projection of the active layer on the base substrate.

For example, in the fingerprint recognition sensor provided by an embodiment of the present disclosure, the photosensitive element further includes: a protective layer, covering the first electrode, the photosensitive layer, the second electrode and the first surface of the base substrate; and a first overlapping electrode, on a side of the protective layer away from the photosensitive layer, the protective layer includes a first via hole and a second via hole, the first overlapping electrode is connected with the second electrode through the first via hole in the protective layer, and the first overlapping electrode is connected with the second conductive sub-structure through the second via hole in the protective layer.

For example, the fingerprint recognition sensor provided by an embodiment of the present disclosure, further including: a third electrode, on a second surface of the base substrate opposite to the first surface and connected with the second conductive sub-structure, wherein the third electrode is configured to input an operating voltage to the photosensitive element through the second conductive sub-structure and the first overlapping electrode.

For example, in the fingerprint recognition sensor provided by an embodiment of the present disclosure, a material of the first overlapping electrode is a transparent electrode material.

For example, in the fingerprint recognition sensor provided by an embodiment of the present disclosure, the thin film transistor further includes: a gate electrode, on a surface of the base substrate away from the photosensitive element; a gate insulating layer, on a side of the gate electrode away from the base substrate and covering the gate electrode; and a source electrode, and a drain electrode, the active layer is located on a side of the gate insulating layer away from the gate electrode, the source electrode and the drain electrode are on a side of the gate insulating layer away from the active layer, the source electrode and the drain electrode are respectively connected with the active layer, the gate insulating layer includes a third via hole, the source electrode or the drain electrode is connected with the first conductive sub-structure in the base substrate through the third via hole in the gate insulating layer.

For example, the fingerprint recognition sensor provided by an embodiment of the present disclosure further including: a passivation layer, on a side of the source electrode and the drain electrode away from the active layer, and covering the source electrode, the drain electrode, the active layer and the gate insulating layer.

At least one embodiment of the present disclosure further provides a manufacturing method of a fingerprint recognition sensor, which includes: providing a base substrate, wherein the base substrate includes a conductive structure penetrating through the base substrate in a thickness direction perpendicular to the base substrate; forming a thin film transistor on a side of the base substrate; and forming a photosensitive element on a side of the base substrate away from the thin film transistor, the thin film transistor, the base substrate and the photosensitive element are sequentially stacked in the thickness direction perpendicular to the base substrate, and the photosensitive element is connected with the thin film transistor through the conductive structure.

For example, in the manufacturing method provided by an embodiment of the present disclosure, the conductive structure includes a first conductive sub-structure and a second conductive sub-structure which are separated, and both the first conductive sub-structure and the second conductive sub-structure penetrate through the base substrate in the thickness direction of the base substrate; and forming the photosensitive element on the side of the base substrate away from the thin film transistor includes: forming a first electrode on a first surface of the base substrate; forming a photosensitive layer on a side of the first electrode away from the base substrate; and forming a second electrode on a side of the photosensitive layer away from the first electrode, the first electrode is connected with the first conductive sub-structure, and the second electrode is configured to be electrically connected with the second conductive sub-structure.

For example, in the manufacturing method provided by an embodiment of the present disclosure, forming the photosensitive element on the side of the base substrate away from the thin film transistor further includes: forming a protective layer on a side of the second electrode away from the photosensitive layer, wherein the protective layer covers the first electrode, the photosensitive layer, the second electrode and the first surface of the base substrate; and forming a first overlapping electrode on a side of the protective layer away from the photosensitive layer, wherein the first overlapping electrode is on a side of the protective layer away from the photosensitive layer, the protective layer includes a first via hole and a second via hole, the first overlapping electrode is connected with the second electrode through the first via hole in the protective layer, and the first overlapping electrode is connected with the second conductive sub-structure through the second via hole in the protective layer.

For example, the manufacturing method provided by an embodiment of the present disclosure, further including: forming a third electrode on a second surface of the base substrate opposite to the first surface, the third electrode is connected with the second conductive sub-structure, and the third electrode is configured to input an operating voltage to the photosensitive element through the second conductive sub-structure and the first overlapping electrode.

For example, in the manufacturing method provided by an embodiment of the present disclosure, forming the thin film transistor on the side of the base substrate includes: forming a gate electrode on a side of the base substrate; forming a gate insulating layer on a side of the gate electrode away from the base substrate, wherein the gate insulating layer covers the gate electrode; forming an active layer on a side of the gate insulating layer away from the gate electrode; and forming a source electrode and a drain electrode on a side of the active layer away from the gate insulating layer, the source electrode and the drain electrode are respectively connected with the active layer, the gate insulating layer includes a third via hole, the source electrode or the drain electrode is connected with the first conductive sub-structure in the base substrate through the third via hole in the gate insulating layer.

For example, in the manufacturing method provided by an embodiment of the present disclosure, an orthographic projection of the photosensitive layer on the base substrate overlaps with an orthographic projection of the active layer on the base substrate.

For example, in the manufacturing method provided by an embodiment of the present disclosure, the orthographic projection of the photosensitive layer on the base substrate covers the orthographic projection of the active layer on the base substrate.

For example, the manufacturing method provided by an embodiment of the present disclosure further includes: forming a passivation layer on a side of the source electrode and the drain electrode away from the active layer, the passivation layer covers the source electrode, the drain electrode, the active layer and the gate insulating layer.

At least one embodiment of the present disclosure further provides a display device, including any one of the above-mentioned fingerprint recognition sensor.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

In a current OLED display device, a fingerprint recognition sensor can include a photosensitive element and a thin film transistor which are adjacently arranged. The arrangement of the thin film transistor needs to occupy a certain space, so that the arrangement space of the photosensitive element is compressed. The effective photosensitive area of the fingerprint recognition sensor comes from the photosensitive element, and therefore, the compressed arrangement space of the photosensitive element will lead to a small effective photosensitive area of the fingerprint recognition sensor, and further, lead to a weak photocurrent signal generated by the fingerprint recognition sensor, which results in low accuracy of fingerprint recognition.

Figure 1:
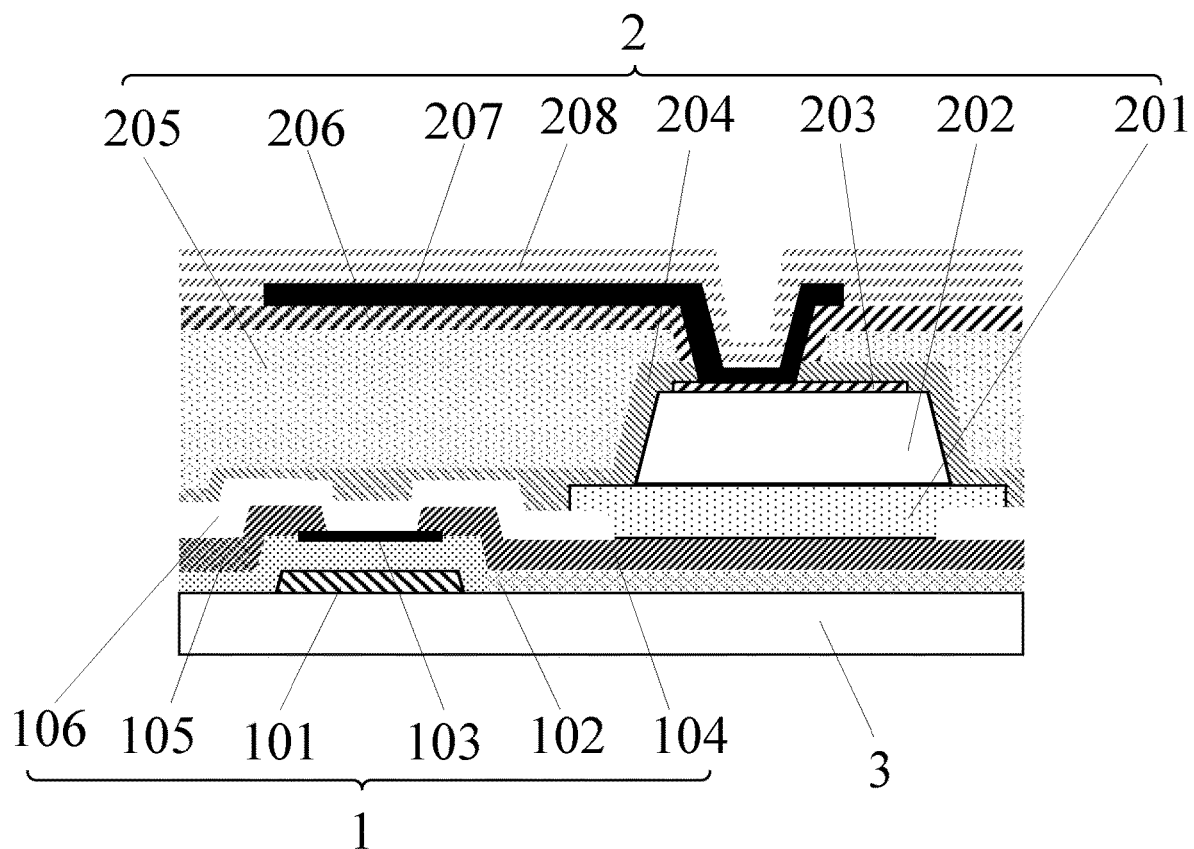
FIG. 1 shows a schematic cross-sectional view of a fingerprint recognition sensor.

FIG. 1 is a schematic cross-sectional view of a fingerprint recognition sensor. As illustrated by FIG. 1, the fingerprint recognition sensor includes a thin film transistor 1 and a photosensitive element 2; the thin film transistor 1 and the photosensitive element 2 can be disposed at the same side of the base substrate 3, and can be disposed adjacent to each other.

For example, as illustrated by FIG. 1, the thin film transistor 1 can include a gate electrode 101 formed on the base substrate 3, a gate insulating layer 102 covering the gate electrode 101, an active layer 103 formed on the gate insulating layer 102, a source electrode 104 and a drain electrode 105 respectively connected with the active layer 103, and a first passivation layer 106 covering all of the above structures. The photosensitive element 2 can include a first electrode 201 formed on the first passivation layer 106, a photosensitive layer 202 formed on the first electrode 201, a second electrode 203 formed on the photosensitive layer 202, a protective layer 204 covering all of the above structures, a resin layer 205 covering the protective layer 204, a second passivation layer 206 covering the resin layer 205, an overlapping electrode 207 (usually referred to as Top Metal) formed on the second passivation layer 206, and a buffer layer 208 covering the second passivation layer 206 and the overlapping layer 207.

The first electrode 201 is connected with the source electrode 104 of the thin film transistor 1 through a via hole in the first passivation layer 106. The material of the second electrode 203 is usually ITO (Indium Tin Oxide). The overlapping electrode 207 is connected with the second electrode 203 through the resin layer 205 and a via hole in the resin layer 205. The overlapping electrode 207 is usually made of a conductive metal material.

In practical application, the inventor(s) of the present application has found that the fingerprint recognition sensor shown in FIG. 1 has at least the following problems.

Problem 1: The thin film transistor 1 and the photosensitive element 2 are arranged on the same side of the base substrate 3, and they are adjacent to each other, so that the space of the photosensitive element 2 will be compressed due to the arrangement of the thin film transistor 1, thereby reducing the effective photosensitive area of the photosensitive element 2. For a display device designed with high-density fingerprint recognition sensors, the manner in which the thin film transistor 1 and the photosensitive element 2 are arranged adjacent to each other has a greater influence on the effective photosensitive area of the photosensitive element 2. For example, in the case where the number of fingerprint recognition sensors per inch in the display device is increased from 400 to 500, the effective photosensitive area of the photosensitive element 2 will be sharply reduced by about 60%, and the magnitude of the photocurrent signal will also be sharply reduced by about 60%, which will seriously affect the detection of photocurrent signals.

Problem 2: The overlapping electrode 207 on the top of the photosensitive element 2 is usually made of a conductive metal material, but the light transmittance of the metal material is low, so that the part of the photosensitive element blocked by the overlapping electrode 207 cannot effectively sense light, thus further reducing the effective photosensitive area of the fingerprint recognition sensor. For example, the overlapping electrode 207 has a great influence on the effective photosensitive area of the fingerprint recognition sensor, especially for a display device designed with high-density fingerprint recognition sensors. For example, in the case where the display device includes 500 fingerprint recognition sensors per inch, a proportion between the area of a part of the overlapping electrode blocking the photosensitive element 2 and the effective photosensitive area of the fingerprint recognition sensor is about 17%. And, in the case where the density of fingerprint recognition sensor is higher, this proportion will be higher, and accordingly, the overlapping electrode 207 has a greater influence on the effective photosensitive area of the fingerprint recognition sensor.

Figure 2:
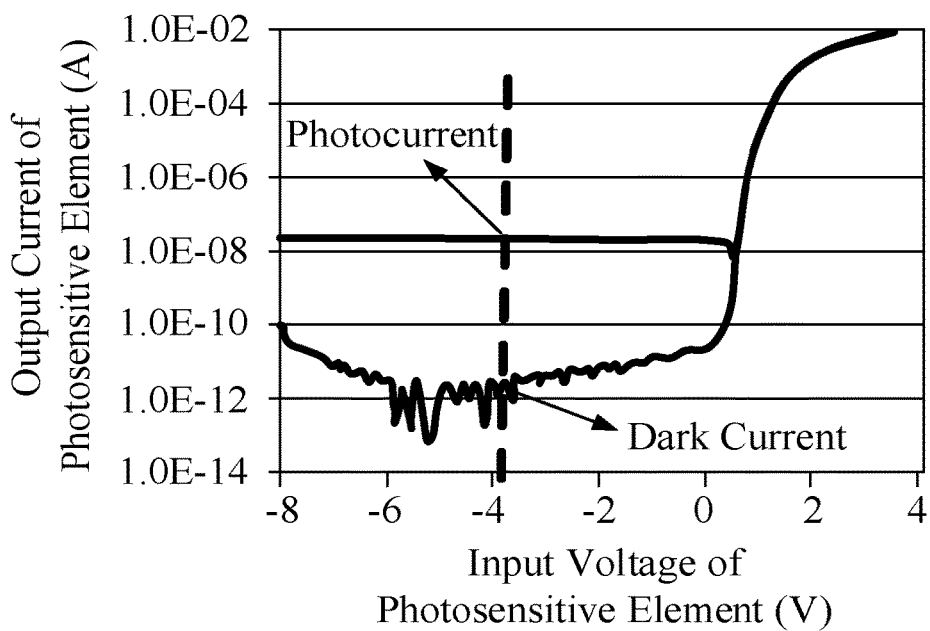
FIG. 2 shows an I-V characteristic curve of a photosensitive element.

FIG. 2 is an I-V (current-voltage) characteristic curve of the photosensitive element 2. As illustrated by FIG. 2, the photosensitive element 2 can normally work under a negative bias voltage of −4V (volt), and in the case where the negative bias voltage of −4V is input to the photosensitive element 2, the photocurrent output by the photosensitive element 2 is as illustrated by FIG. 2. The smaller the effective photosensitive area of the fingerprint recognition sensor, the smaller the photocurrent of the photosensitive element 2, and the lower the accuracy of fingerprint recognition.

Problem 3: if the second electrode 203 and the overlapping electrode 207 are made of different materials, the dark current of the photosensitive element 2 will caused to be large, and the sensitivity of the photosensitive element 2 will caused to be low. For example, because the second electrode 203 and the overlapping electrode 207 are made of different materials, the material matching degree between the second electrode 203 and the overlapping electrode 207 is low and the noise is great. The dark current output by the photosensitive element 2 is as illustrated by FIG. 2. The greater the dark current of the photosensitive element 2, the lower the sensitivity of the photosensitive element 2, and the lower the accuracy of fingerprint recognition.

Problem 4: The active layer 103 of the thin film transistor 1 is easily made conductive in the manufacturing process of the photosensitive element 2, thus reducing the magnitude of the photocurrent signal generated by the photosensitive element 2. For example, because the thin film transistor 1 and the photosensitive element 2 are arranged at the same side of the base substrate 3, the active layer 103 of the thin film transistor 1 is easily interfered by hydrogen ions and is made conductive to a certain extent, that is, the thin film transistor 1 can still conduct many charges in the off state. However, the photosensitive layer 202 of the photosensitive element 2 needs to be deposited and formed in an environment which is rich in hydrogen ions. Therefore, when the photosensitive layer 202 is deposited, the active layer 103 is easily made conductive in the hydrogen ion environment. Therefore, in the case where the thin film transistor 1 is turned off, some photo-generated charges stored in the photosensitive element 2 will be lost, thus reducing the magnitude of the photocurrent signal.

Figure 3:
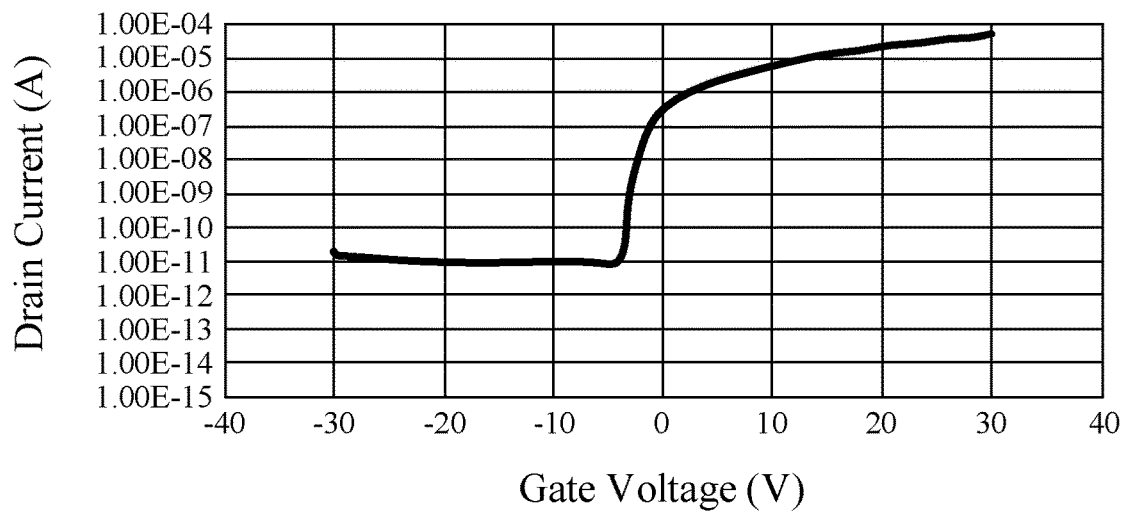
FIG. 3 shows an I-V characteristic curve of a thin film transistor.

FIG. 3 shows an I-V characteristic curve of the thin film transistor 1. Referring to FIG. 3, in the case where the gate voltage is less than −10V, the thin film transistor 1 is in the off state, but the drain current thereof has reached the order of $10^{-11}$ A, while in the case where a normal thin film transistor 1 is in the off state, the drain current thereof should be of the order of $10^{-15}$ A. Therefore, the active layer 103 of the thin film transistor 1 corresponding to FIG. 3 has been conductive to a certain extent. Therefore, in the case where the thin film transistor 1 is turned off, some photo-generated charges generated by the photosensitive element 2 will still be released through the channel of the active layer, thus reducing the magnitude of the photocurrent signal.

Problem 5: There are many film layers to be formed after the protective layer 204 is formed, and light will be lost in each film layer, so that the light transmittance is reduced. Moreover, more film layer treatment processes, such as deposition process and photolithography process, etc., are needed, so that the manufacturing process of the fingerprint recognition sensor is cumbersome.

In this regard, the embodiments of the present disclosure provide a fingerprint recognition sensor, a manufacturing method thereof, and a display device. The fingerprint recognition sensor includes: a base substrate; a thin film transistor on a side of the base substrate; and a photosensitive element on a side of the base substrate away from the thin film transistor. The thin film transistor, the base substrate and the photosensitive element are sequentially stacked along a thickness direction perpendicular to the base substrate, the base substrate includes a conductive structure penetrating through the base substrate in the thickness direction perpendicular to the base substrate, and the photosensitive element is connected with the thin film transistor through the conductive structure. Therefore, by forming the photosensitive element and the thin film transistor on opposite sides of the base substrate and connecting the photosensitive element and the thin film transistor through the conductive structure in the base substrate, the fingerprint recognition sensor can prevent the space of the photosensitive element from being compressed, so that the effective photosensitive area of the photosensitive element can be increased, that is, the effective photosensitive area of the fingerprint recognition sensor can be increased, thereby enhancing the photocurrent signal generated by the fingerprint recognition sensor and further improving the accuracy of fingerprint recognition.

Hereinafter, the fingerprint recognition sensor, the manufacturing method thereof, and the display device provided by the embodiments of the present disclosure will be described in detail with reference to the accompanying drawings.

Figure 4:
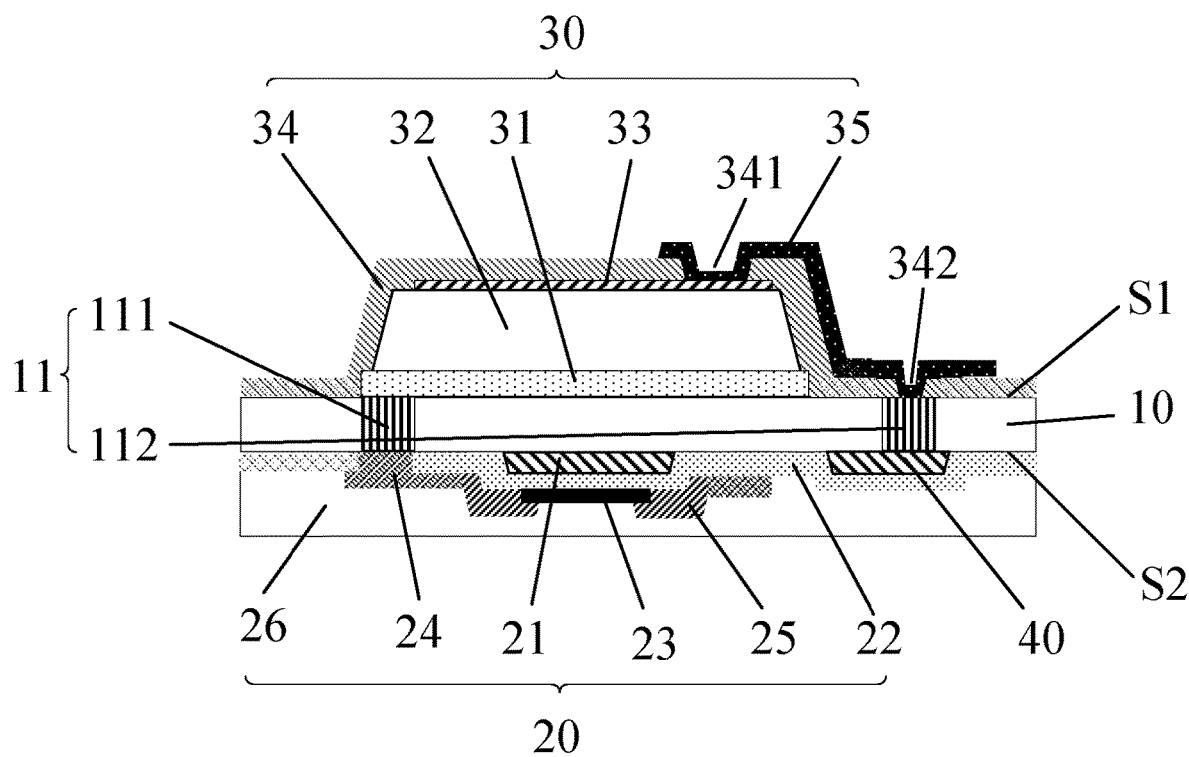
FIG. 4 shows a schematic cross-sectional view of a fingerprint recognition sensor according to an embodiment of the present disclosure.

An embodiment of the present disclosure provides a fingerprint recognition sensor. FIG. 4 shows a schematic cross-sectional view of a fingerprint recognition sensor according to an embodiment of the present disclosure. As illustrated by FIG. 4, the fingerprint recognition sensor includes a base substrate 10, a thin film transistor (TFT) 20 and a photosensitive element 30. The base substrate 10, the thin film transistor 20 and the photosensitive element 30 are stacked in a direction (i.e., the thickness direction) perpendicular to the base substrate 10, that is, the thin film transistor 20 is located on a side of the base substrate 10, and the photosensitive element 30 is located on a side of the base substrate 10 away from the thin film transistor 20. The base substrate 10 can include a conductive structure 11 penetrating through the base substrate 10 in the thickness direction of the base substrate 10, and the photosensitive element 30 can be connected with the thin film transistor 20 through the conductive structure 11 in the base substrate 10. The thin film transistor 20 can be configured to release photo-generated charges generated by the photosensitive element 30.

With regard to the above-mentioned problem 1, in the fingerprint recognition sensor provided by the embodiment of the present disclosure, the thin film transistor 20, the base substrate 10, and the photosensitive element 30 can be stacked in the thickness direction perpendicular to the base substrate 10, that is, the thin film transistor 20 and the photosensitive element 30 can be respectively arranged on opposite surfaces of the base substrate 10, and they can be electrically connected through the conductive structure 11 in the base substrate 10 to realize the control of the photosensitive element 30. Therefore, there is no need to compress the arrangement space of the photosensitive element 30 when arranging the thin film transistor 20, so that the effective photosensitive area of the photosensitive element 30 can be increased, that is, the effective photosensitive area of the fingerprint recognition sensor can be increased, thereby enhancing the photocurrent signal generated by the fingerprint recognition sensor and further improving the accuracy of fingerprint recognition.

For example, as illustrated by FIG. 4, the conductive structure 11 in the base substrate 10 can include a first conductive sub-structure 111 and a second conductive sub-structure 112 which are separated, and both the first conductive sub-structure 111 and the second conductive sub-structure 112 penetrate through the base substrate 10 in the thickness direction perpendicular to the base substrate 10. For example, the material of the conductive structure 11 can be a conductive material such as copper metal, etc., without being specifically limited in the embodiment of the present disclosure.

Accordingly, the photosensitive element 30 includes a first electrode 31 formed on a first surface S1 of the base substrate 10, a photosensitive layer 32 formed on the first electrode 31, a second electrode 33 formed on the photosensitive layer 32, a protective layer 34, and a first overlapping electrode 35. The first electrode 31 is connected with the first conductive sub-structure 111. The protective layer 34 covers the first electrode 31, the photosensitive layer 32, the second electrode 33 and the first surface S1 of the base substrate 10. The first overlapping electrode 35 is located on a side of the protective layer 34 away from the base substrate 10. The first overlapping electrode 35 can be connected with the second electrode 33 through a first via hole 341 in the protective layer 34, and the first overlapping electrode 35 can be connected with the second conductive sub-structure 112 through a second via hole 342 in the protective layer 34.

For example, the photosensitive element 30 can be a PIN photodiode, and correspondingly, the photosensitive layer 32 can specifically include an N-type semiconductor layer, an intrinsic semiconductor layer and a P-type semiconductor layer, which are stacked in the thickness direction of the base substrate 10, and the N-type semiconductor layer is disposed close to the first electrode 31.

When the fingerprint recognition sensor provided by the embodiment of the present disclosure works, a negative bias voltage required for working can be applied to the photosensitive layer 32 through the second electrode 33, and then, when photons with sufficient energy are incident on the photosensitive layer 32, the photosensitive layer 32 can be excited to generate photo-generated charges, thereby forming a photocurrent signal required for fingerprint recognition.

The first electrode 31 can be connected with the source electrode or the drain electrode of the thin film transistor 20 through the first conductive structure 111. For convenience of description, the following description is presented by taking that the first electrode 31 is connected with the source electrode of the thin film transistor 20 through the first conductive structure 111 as an example. It can be understood that the positions of the source electrode and the drain electrode of the thin film transistor 20 can be interchanged. After the photocurrent signal is formed by the photosensitive layer 32, the display device can form a fingerprint image according to the photo-current signal, and then perform fingerprint recognition. After that, the first electrode 31 connected with the photo-sensitive layer 32 can release photo-generated charges through the thin film transistor 20. When the photosensitive layer 32 works, the gate electrode of the thin film transistor 20 can be turned off, and then the photo-generated charges generated by the photosensitive layer 32 can be introduced into the active layer of the thin film transistor 20 through the first electrode 31, the first conductive sub-structure 111 and the source electrode of the thin film transistor 20 in turn, and accumulated in the active layer. When the gate electrode of the thin film transistor 20 is turned on, the photo-generated charges can flow from the channel of the active layer to the drain electrode of the thin film transistor 20, and then be conducted away.

In addition, as for the connection mode between the first overlapping electrode 35 and the second conductive substructure 112, in one implementation, referring to FIG. 4, the first overlapping electrode 35 can be connected with the second conductive sub-structure 112 directly through the second via hole 342 in the protective layer 34. In another implementation, referring to FIG. 5, the fingerprint recognition sensor can further include a second overlapping electrode 01, the second overlapping electrode 01 can be arranged on the same layer as the first electrode 31 of the photosensitive element 30, the thickness of the second overlapping electrode 01 can be the same as that of the first electrode 31, and the second overlapping electrode 01 can be connected with the first overlapping electrode 35 and the second conductive structure 112, respectively. As illustrated by FIG. 4, the bottom of the second via hole 342 in the protective layer 34 is equivalent to the second overlapping electrode 01, and accordingly, the first overlapping electrode 35 can be connected with the second conductive electronic structure 112 through the second via hole 342 in the protective layer 34 and the second overlapping electrode 01. The embodiment of the present disclosure does not specifically limit the connection mode between the first overlapping electrode 35 and the second conductive sub-structure 112.

In some examples, referring to FIG. 4, the area of the second electrode 33 can be smaller than the area of the photosensitive layer 32, so that the leakage current at the edge of the photosensitive element 30 can be reduced, and thus the sensitivity of the photosensitive element 30 can be improved.

In some examples, referring to FIG. 4, the fingerprint recognition sensor can further include a third electrode 40, the third electrode 40 is formed on a second surface S2 of the base substrate 10 opposite to the first surface S1 and is connected with the second conductive sub-structure 112. The third electrode 40 can be configured to input an operating voltage, i.e., a negative bias voltage, to the photosensitive element 30 through the second conductive structure 112 and the first overlapping electrode 35. That is, the operating voltage required by the photosensitive element 30 can be input to the third electrode 40, and then the third electrode 40 can input the operating voltage to the photosensitive layer 32 through the second conductive sub-structure 112 in the base substrate 10, the first overlapping electrode 35 and the second electrode 33 in turn.

In some examples, the third electrode 40 can be arranged on the same layer as the gate electrode of the thin film transistor 20, so that the third electrode 40 and the gate electrode of the thin film transistor 20 can be formed at the same time by one patterning process, thus simplifying the manufacturing process of the fingerprint recognition sensor.

Figure 6:
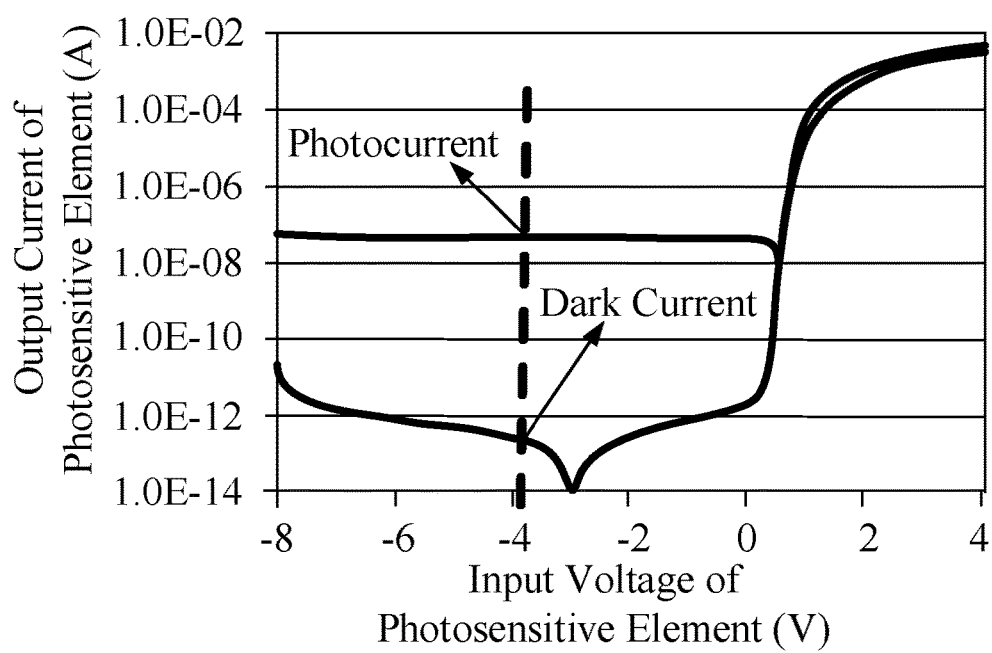
FIG. 6 shows an I-V characteristic curve of a photosensitive element provided by an embodiment of the present disclosure, in which a first overlapping electrode and a second electrode are made of transparent ITO.

With regard to the above-mentioned problem 2, in the fingerprint recognition sensor provided by the embodiment of the present disclosure, the material of the first overlapping electrode 35 can be a transparent electrode material, such as ITO, etc., and the embodiments of the present disclosure are not limited thereto. That is, the first overlapping electrode 35 can be made of a transparent electrode material, so that the part of the photosensitive element shielded by the first overlapping electrode 35 can effectively sense light, thereby increasing the effective photosensitive area of the fingerprint recognition sensor. FIG. 6 shows an I-V (current-voltage) characteristic curve of a photosensitive element 30 in which the first overlapping electrode 35 and the second electrode 33 are made of transparent ITO. Comparing FIG. 6 with FIG. 2, in contrast to the photosensitive element in which the overlapping electrode is made of metal, the photocurrent of the photosensitive element 30 in which the first overlapping electrode 35 is made of transparent ITO as illustrated by FIG. 6 can be increased by about 17%.

With regard to the above-mentioned problem 3, in the fingerprint recognition sensor provided by the embodiment of the present disclosure, the material of the first overlapping electrode 35 and the material of the second electrode 33 can be the same material, and for example, both can be ITO material. Because the matching degree between the same materials is high, the noise is low, and therefore, the dark current of the photosensitive element 30 can be reduced and the sensitivity of the photosensitive element 30 can be improved. Comparing FIG. 6 with FIG. 2, in contrast to the photosensitive element with lap joint of different materials, the dark current of the photosensitive element 30 with lap joint of the same material as illustrated by FIG. 6 can be reduced by about 60%.

In some examples, as illustrated by FIG. 4, the thin film transistor 20 includes a gate electrode 21, a gate insulating layer 22 covering the gate electrode 21, an active layer 23 formed on the gate insulating layer 22, a source electrode 24 and a drain electrode 25 disposed on the same layer, and a passivation layer 26, which are formed on the second surface S2 of the base substrate 10 opposite to the first surface S1. The source electrode 24 and the drain electrode 25 are respectively connected with the active layer 23. The source electrode 24 or the drain electrode 25 is connected with the first conductive sub-structure 111 in the base substrate 10 through the third via hole 221 in the gate insulating layer 22. The passivation layer 26 covers the source electrode 24, the drain electrode 25, the active layer 23 and the gate insulating layer 22. It should be noted that the positions of the source electrode 24 and the drain electrode 25 of the thin film transistor 20 can be interchanged, and the position of the source electrode and the position of the drain electrode shown in each figure do not constitute a limitation to the present disclosure.

For example, as illustrated by FIG. 4, an orthographic projection of the photosensitive layer 32 on the base substrate 10 overlaps with an orthographic projection of the active layer 23 on the base substrate 10. For another example, the orthographic projection of the photosensitive layer 32 on the base substrate 10 covers the orthographic projection of the active layer 23 on the base substrate 10.

With regard to the above-mentioned problem 4, in the fingerprint recognition sensor provided by the embodiment of the present disclosure, the thin film transistor 20 and the photosensitive element 30 can be respectively arranged on opposite surfaces of the base substrate 10, instead of being on the same side of the base substrate 10; so, the base substrate 10 can play a natural protection role when the photosensitive layer 32 of the photosensitive element 30 is deposited and formed in a hydrogen ion environment, thereby preventing the active layer 23 of the thin film transistor 20 from being made conductive by hydrogen ions. With regard to the above-mentioned problem 5, in the fingerprint recognition sensor provided by the embodiment of the present disclosure, the resin layer, the second passivation layer and the buffer layer are reduced, so that three film layer treatment processes can be reduced, and the manufacturing process of the fingerprint recognition sensor can be simplified. In addition, the light transmittance can be improved while reducing three film layers, so that more light can be received by the photosensitive element 30, and the signal magnitude of the photocurrent signal is improved.

The fingerprint recognition sensor provided by the embodiment of the invention can include a base substrate, a thin film transistor and a photosensitive element, and the thin film transistor, the base substrate and the photosensitive element are stacked in the thickness direction perpendicular to the base substrate. The base substrate includes a conductive structure penetrating through the base substrate in the thickness direction, and the photosensitive element can be connected with the thin film transistor through the conductive structure in the base substrate. In the embodiment of the invention, the thin film transistor, the base substrate and the photosensitive element are stacked in the thickness direction perpendicular to the base substrate, that is, the thin film transistor and the photosensitive element can be respectively arranged on opposite surfaces of the base substrate, and they can be electrically connected through the conductive structure in the base substrate to realize the control of the photosensitive element. Therefore, when the thin film transistor is arranged, the arrangement space of the photosensitive element does not need to be compressed, so that the effective photosensitive area of the photosensitive element can be increased, thereby enhancing the photocurrent signal generated by the fingerprint recognition sensor and improving the accuracy of fingerprint recognition.

Figure 7:
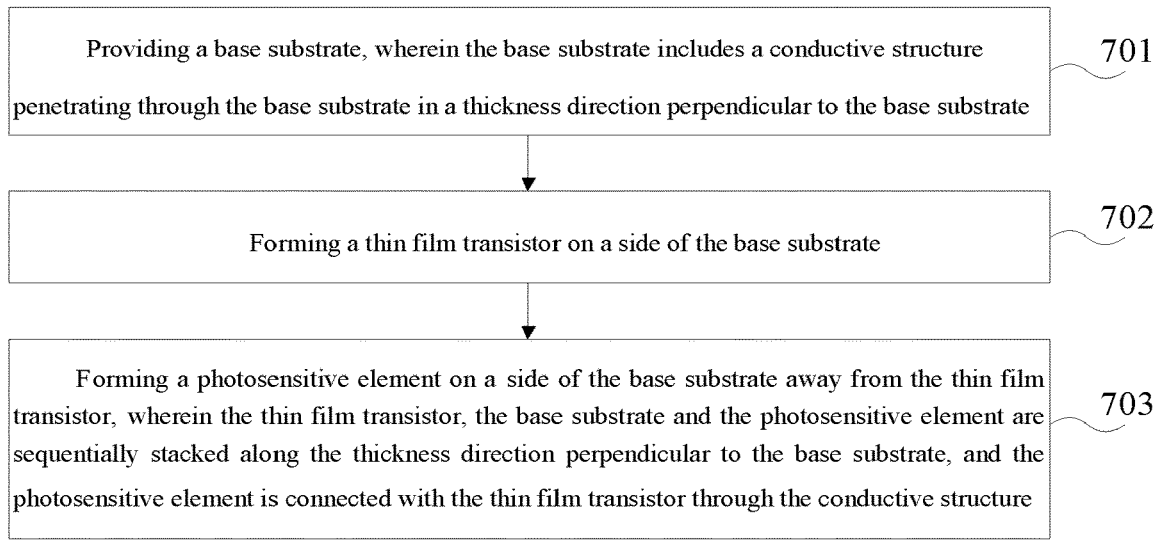
FIG. 7 shows a flowchart of a manufacturing method of a fingerprint recognition sensor according to an embodiment of the present disclosure.

FIG. 7 shows a flowchart of a manufacturing method of a fingerprint recognition sensor according to an embodiment of the present disclosure. The manufacturing method can include the following steps.

Step 701: providing a base substrate, the base substrate includes a conductive structure penetrating the base substrate in a direction (i.e., a thickness direction) perpendicular to the base substrate.

Figure 8:
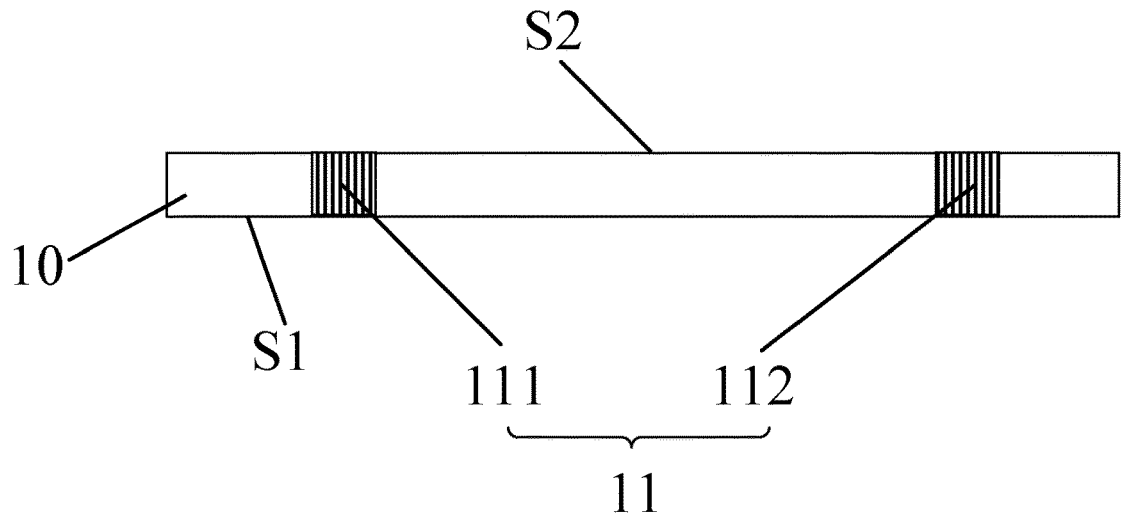
FIG. 8 shows a schematic cross-sectional view of a base substrate provided by an embodiment of the present disclosure.

In the manufacturing method of the fingerprint recognition sensor provided by the embodiment of the present disclosure, a through hole can be formed in the base substrate 10 in the thickness direction perpendicular to the base substrate 10 by mean of laser drilling, etc., and then a conductive material, such as copper metal, etc., can be electroformed in the through hole, so that a conductive structure 11 penetrating through the base substrate 10 in the thickness direction of the base substrate 10 can be obtained, that is, the base substrate 10 having the conductive structure 11 can be obtained, as illustrated by FIG. 8. Of course, a finished base substrate having the conductive structure 11 can also be directly provided, without being specifically limited in the embodiment of the present disclosure.

For example, the conductive structure 11 in the base substrate 10 can include a first conductive structure 111 and a second conductive structure 112 which are separated, and both the first conductive structure 111 and the second conductive structure 112 penetrate through the base substrate 10 in the thickness direction of the base substrate 10.

Step 702: forming a thin film transistor on a second surface of the base substrate opposite to a first surface, that is, forming a thin film transistor on a side of the base substrate.

In the embodiment of the present disclosure, the base substrate 10 can include a first surface S1 and a second surface S2 which are opposite to each other, the first surface S1 of the base substrate 10 can be used for manufacturing the photosensitive element 30 thereon, and the second surface S2 of the base substrate 10 can be used for manufacturing the thin film transistor 20 thereon.

For example, this step can be specifically realized through the following sub-steps (1) to (5), including:

Sub-step (1): forming a gate electrode 21 on the second surface S2 of the base substrate 10 opposite to the first surface S1.

Figure 9:
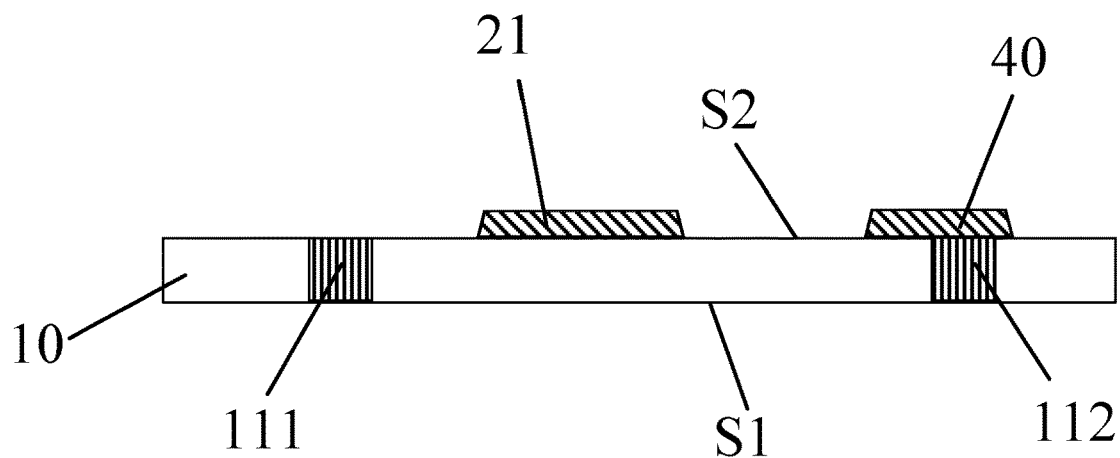
FIG. 9 shows a schematic cross-sectional view of a fingerprint recognition sensor formed with a gate electrode and a third electrode according to an embodiment of the present disclosure.

For example, sub-step (1) can specifically include: forming a gate electrode 21 and a third electrode 40 on the second surface S2 of the base substrate 10 opposite to the first surface S1. The third electrode 40 is connected with the second conductive sub-structure 112, as illustrated by FIG. 9. The third electrode 40 can be configured to input an operating voltage to the photosensitive element through the second conductive structure 112 and a first overlapping electrode, the third electrode 40 is the input terminal of the operating voltage of the photosensitive element, and the first overlapping electrode belongs to the photosensitive element 30. The gate electrode 21 and the third electrode 40 can be formed on the same layer by one photolithography process, so that the manufacturing process of the fingerprint recognition sensor can be reduced.

For example, the material of the gate electrode 21 can include at least one selected from the group consisting of Mo, Al, Cu and Ti, and the embodiments of the present disclosure are not specifically limited thereto.

Sub-step (2): forming a gate insulating layer covering the gate electrode.

Sub-step (3): forming an active layer on the gate insulating layer.

Figure 10:
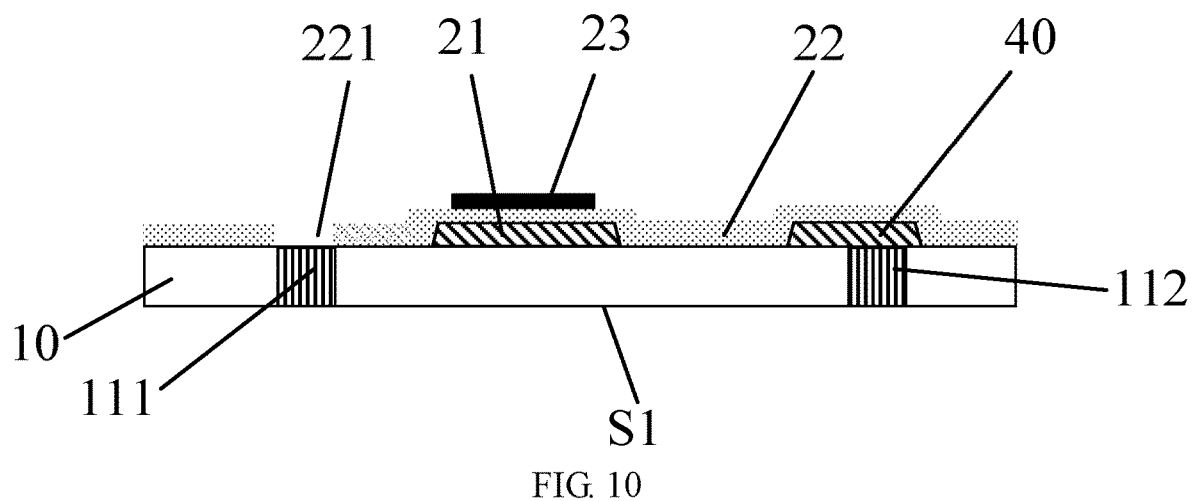
FIG. 10 shows a schematic cross-sectional view of a fingerprint recognition sensor formed with a gate insulating layer and an active layer according to an embodiment of the present disclosure.

For example, a gate insulating material layer and an active material layer can be formed in sequence by deposition process, then the active material layer can be wet-etched by a first photolithography process to obtain an active layer 23, and then the gate insulating material layer can be dry-etched by a second photolithography process to obtain a third via hole 221 extending to the first conductive sub-structure 111, thereby obtaining a gate insulating layer 22, as illustrated by FIG. 10.

For example, the material of the gate electrode 21 can include at least one selected from the group consisting of SiO, SiON, and SiN, and the material of the active layer 23 can include at least one selected from the group consisting of a-Si, IGZO, IZO, IGZXO, and IGZYO, and the embodiments of the present disclosure are not specifically limited thereto.

Sub-step (4): forming a source electrode and a drain electrode on the same layer, wherein the source electrode and the drain electrode are respectively connected with the active layer, and the source electrode or the drain electrode is connected with the first conductive sub-structure in the base substrate through the third via hole in the gate insulating layer.

Figure 11:
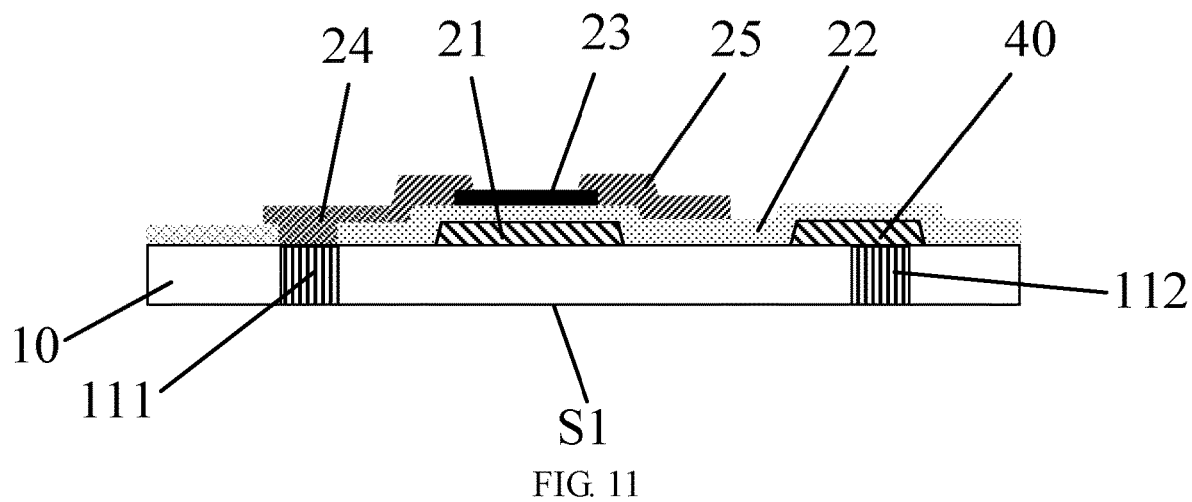
FIG. 11 shows a schematic cross-sectional view of a fingerprint recognition sensor formed with a source electrode and a drain electrode according to an embodiment of the present disclosure.

For example, referring to FIG. 11, the source electrode 24 and the drain electrode 25 can be formed on the same layer by one photolithography process, and in practical applications, the positions of the source electrode 24 and the drain electrode 25 can be interchanged, and the embodiments of the present disclosure are not specifically limited thereto. The source electrode 24 and the drain electrode 25 are respectively connected with the active layer 23, and the source electrode 24 or the drain electrode 25 is connected with the first conductive sub-structure 111 through the third via hole 221 in the gate insulating layer 22.

For example, the materials of the source electrode 24 and the drain electrode 25 can include at least one selected from the group consisting of Mo, Al, Cu, Nd and Ti, and the embodiments of the present disclosure are not specifically limited thereto.

Sub-step (5): forming a passivation layer, the passivation layer covers the source electrode, the drain electrode, the active layer, and the gate insulating layer.

Figure 12:
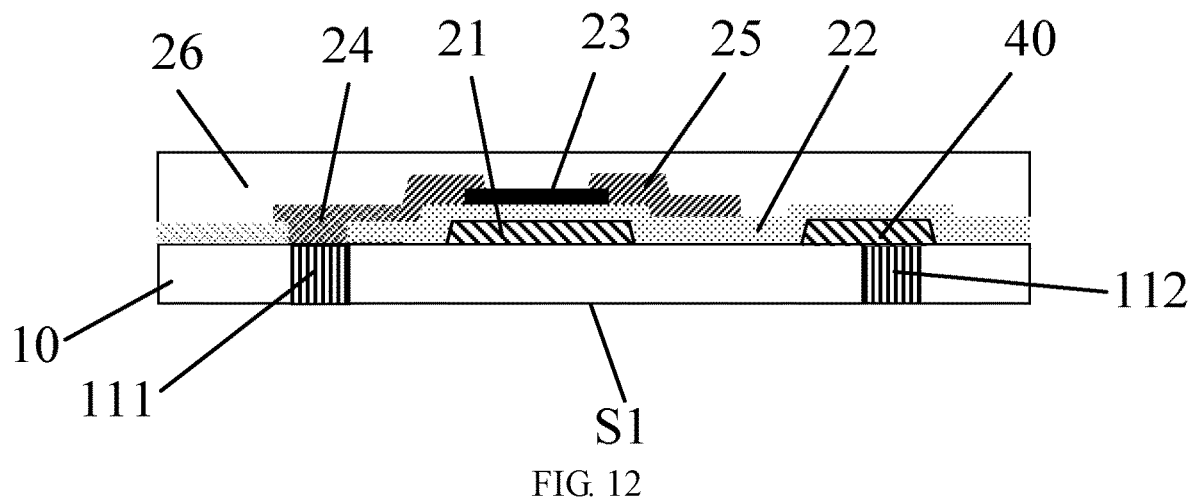
FIG. 12 shows a schematic cross-sectional view of a fingerprint recognition sensor formed with a passivation layer according to an embodiment of the present disclosure.

For example, referring to FIG. 12, a passivation layer 26 covering the source electrode 24, the drain electrode 25, the active layer 23 and the gate insulating layer 22 can be formed by a deposition process.

For example, the material of the passivation layer 26 can include at least one selected from the group consisting of SiOx, SiNx, SiON, and AlOx, and the embodiments of the present disclosure are not specifically limited thereto.

Thus, the thin film transistor 20 can be formed on the second surface S2 of the base substrate 10.

Step 703: forming a photosensitive element on the first surface of the base substrate, that is, forming a photosensitive element on a side of the base substrate away from the thin film transistor, the thin film transistor, the base substrate and the photosensitive element are stacked in the thickness direction of the base substrate, and the photosensitive element is connected with the thin film transistor through the conductive structure in the base substrate.

In the embodiment of the present disclosure, this step can be specifically realized through the following sub-steps (6) to (10), including:

Sub-step (6): forming a first electrode on the first surface of the base substrate, the first electrode is connected with the first conductive sub-structure.

In some examples, the first electrode 31 can be formed on the first surface S1 of the base substrate 10 by a deposition process and a photolithography process, the first electrode 31 can be connected with the first conductive sub-structure 111.

Figure 13:
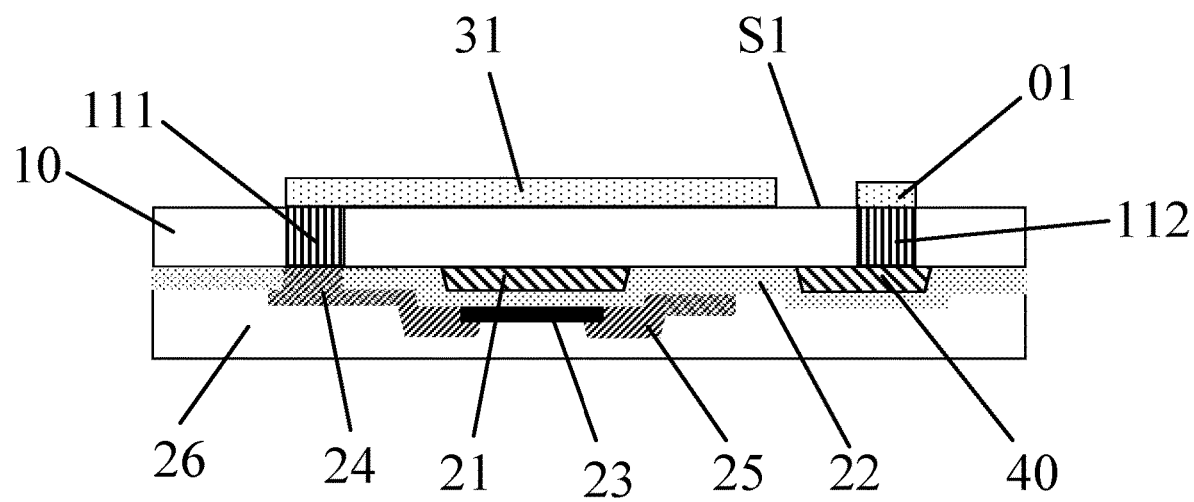
FIG. 13 shows a schematic cross-sectional view of a fingerprint recognition sensor formed with a first electrode and a second overlapping electrode according to an embodiment of the present disclosure.

In some examples, the fingerprint recognition sensor can further include a second overlapping electrode 01, and accordingly, the first electrode 31 and the second overlapping electrode 01 can be formed on the same layer on the first surface S1 of the base substrate 10 by a deposition process and a photolithography process, as illustrated by FIG. 13. The second overlapping electrode 01 can be used to overlap the third electrode 40 and the first overlapping electrode of the photosensitive element 30.

For example, the materials of the first electrode 31 and the second overlapping electrode 01 can include at least one selected from the group consisting of Mo, Al, Cu, Nd and Ti, and the embodiments of the present disclosure are not specifically limited thereto.

The thin film transistor 20 and the photosensitive element 30 can be respectively arranged on opposite surfaces of the base substrate 10, instead of being on the same side of the base substrate 10, so the base substrate 10 can play a natural protection role when the photosensitive layer of the photosensitive element 30 is deposited and formed in a hydrogen ion environment, thereby preventing the active layer of the thin film transistor 20 from being conductive by hydrogen ions.

Sub-step (7): forming a photosensitive layer on a side of the first electrode away from the base substrate.

Sub-step (8): forming a second electrode on a side of the photosensitive layer away from the first electrode.

Figure 14:
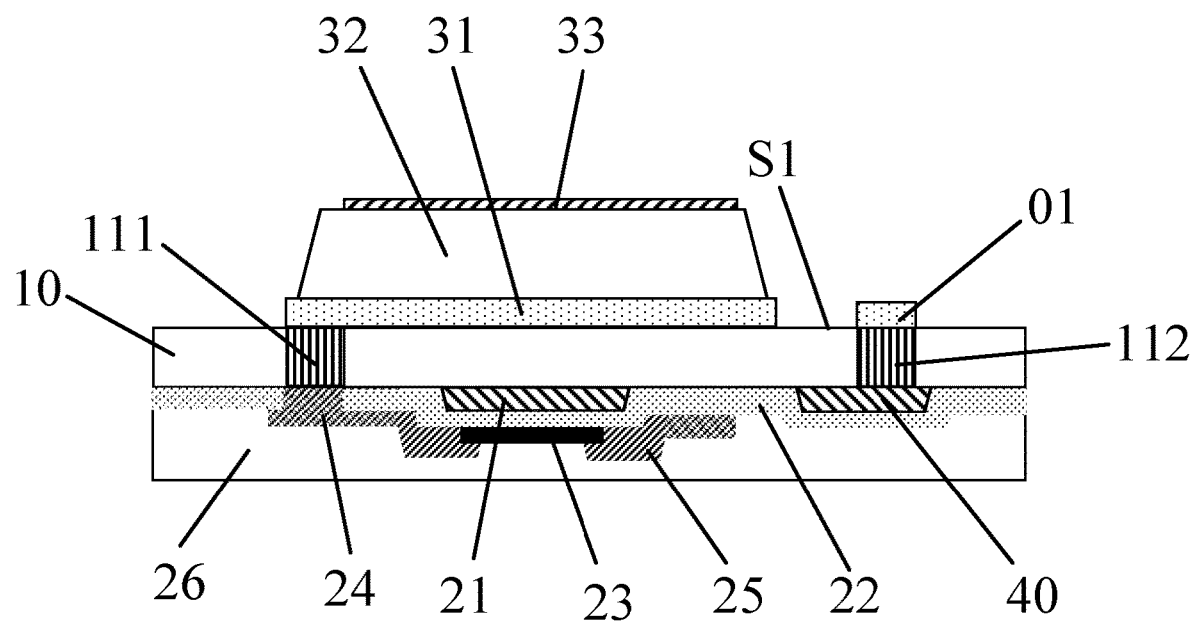
FIG. 14 shows a schematic cross-sectional view of a fingerprint recognition sensor formed with a photosensitive layer and a second electrode according to an embodiment of the present disclosure.

In some examples, a photosensitive material layer and a second electrode material layer can be formed in sequence by deposition process, then the second electrode material layer can be wet-etched by a first photolithography process, and then the photosensitive material layer can be dry-etched by a second photolithography process, such as RIE (Reactive Ion Etching) process to obtain the photosensitive layer 32, and further, the second electrode material layer which has been wet-etched by the first photolithography process can be wet-etched again by a third photolithography process to obtain the second electrode 33, as illustrated by FIG. 14. Referring to FIG. 14, the area of the second electrode 33 can be smaller than that of the photosensitive layer 32, so that the leakage current at the edge of the photosensitive element 30 can be reduced and the sensitivity of the photosensitive element 30 can be improved.

For example, the material of the second electrode 33 can be ITO, etc., and the embodiments of the present disclosure are not specifically limited thereto.

Sub-step (9): forming a protective layer, the protective layer covers the first electrode, the photosensitive layer, the second electrode and the first surface of the base substrate.

Figure 15:
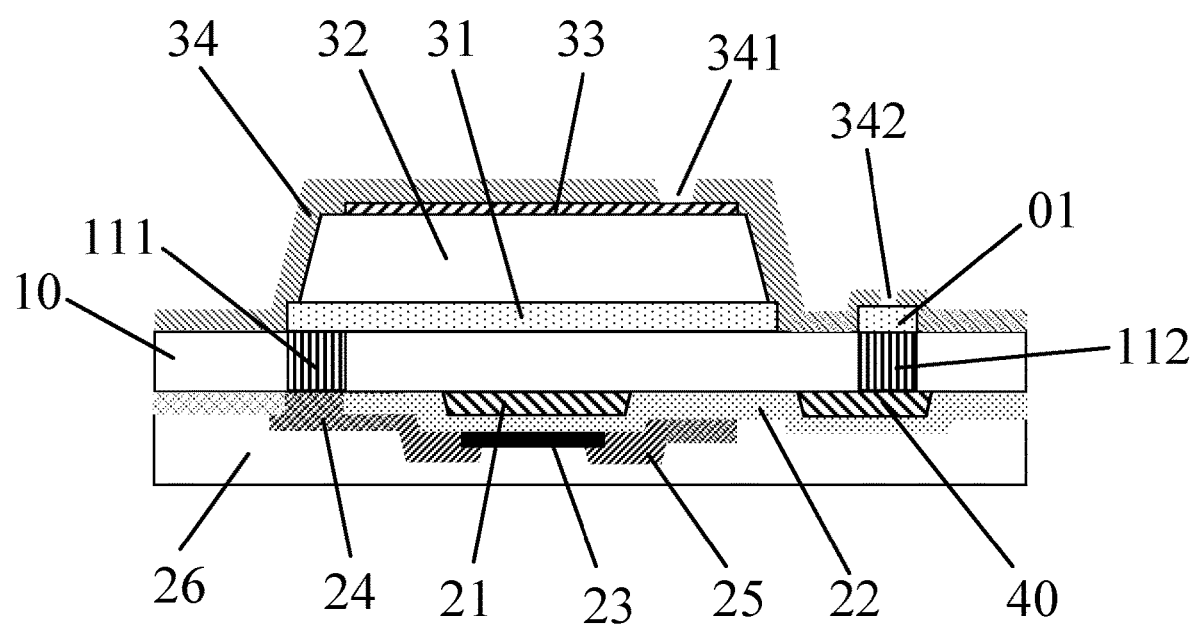
FIG. 15 shows a schematic cross-sectional view of a fingerprint recognition sensor formed with a protective layer according to an embodiment of the present disclosure.

In some examples, a protective layer 34 covering the first electrode 31, the photosensitive layer 32, the second electrode 33 and the first surface S1 of the base substrate 10 can be formed by a deposition process, and then, by a photolithography process, a first via hole 341 can be formed at a position of the protective layer 34 corresponding to the second electrode 33 and a second via hole 342 can be formed at a position of the protective layer 34 corresponding to the second conductive structure 112, as illustrated by FIG. 15.

For example, the material of the protective layer 34 can include at least one selected from the group consisting of SiO, SiN, and SiON, and the embodiments of the present disclosure are not specifically limited thereto.

Sub-step (10): forming a first overlapping electrode, the first overlapping electrode is on a side of the protective layer away from the base substrate, the first overlapping electrode is connected with the second electrode through the first via hole in the protective layer, and the first overlapping electrode is connected with the second conductive sub-structure through the second via hole in the protective layer.

Figure 5:
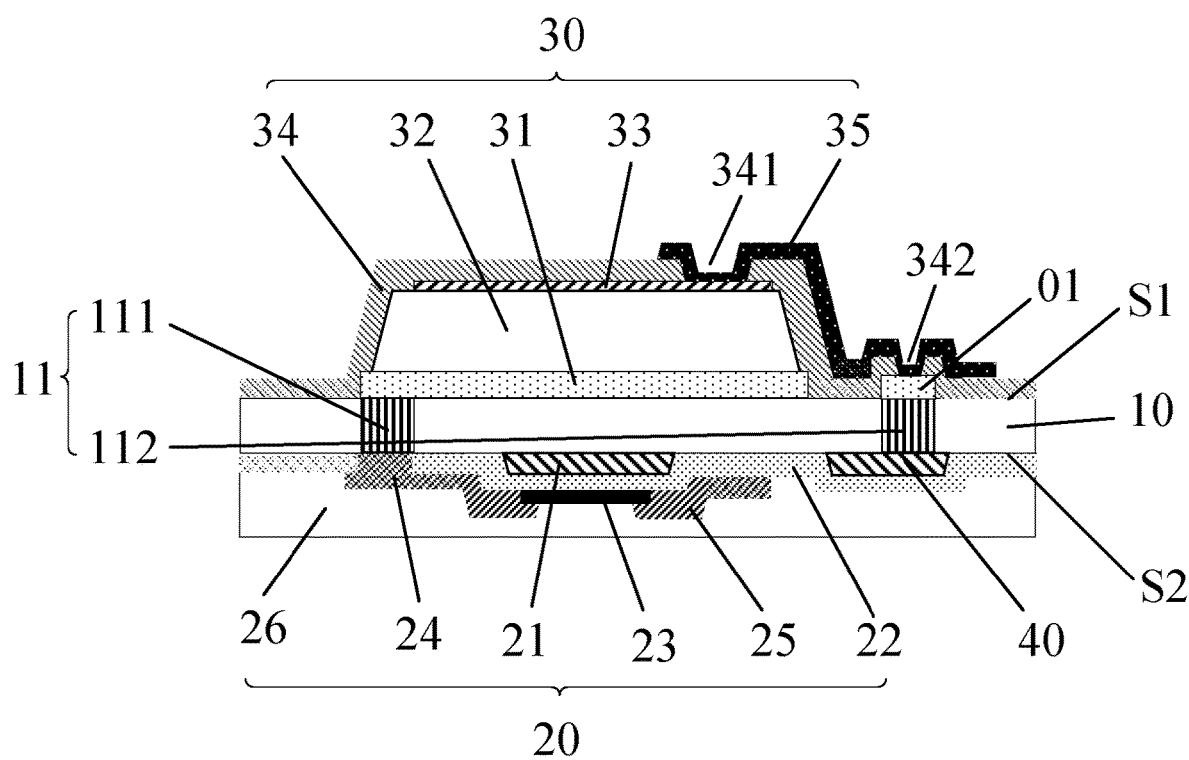
FIG. 5 is a schematic cross-sectional view of another fingerprint recognition sensor provided by an embodiment of the present disclosure.

For example, the first overlapping electrode 35 can be formed on a side of the protective layer 34 away from the base substrate, as illustrated by FIG. 5. The first overlapping electrode 35 can be connected with the second electrode 33 through the first via hole 341 in the protective layer 34, and the first overlapping electrode 35 can also be connected with the second conductive sub-structure 112 through the second via hole 342 in the protective layer 34 or through the second via hole 342 in the protective layer 34 and the second overlapping electrode 01.

In some examples, the material of the first overlapping electrode 35 can be a transparent electrode material, such as ITO, so that the part of the photosensitive element shielded by the first overlapping electrode 35 can effectively sense light, thereby increasing the effective photosensitive area of the fingerprint recognition sensor.

In some examples, the material of the second electrode 33 and the material of the first overlapping electrode 35 can be the same material, and for example, both can be ITO, and the embodiments of the present disclosure are not specifically limited thereto. Because the matching degree between the same materials is high, the noise is low, and therefore, the dark current of the photosensitive element 30 can be reduced, and further, the sensitivity of the photosensitive element 30 can be improved.

Thus, the photosensitive element 30 can be formed on the first surface S1 of the base substrate 10. The fingerprint recognition sensor can be obtained after the thin film transistor 20 and the photosensitive element 30 are respectively formed on the two opposite surfaces of the base substrate 10.

It should be noted that, in practical applications, the implementation order of step 702 and step 703 can be interchanged. In addition, what have been described above only provides one or more forming methods of each structure and one or more optional materials. It can be understood that in practical applications, other methods or materials can be used to form each structure, without being specifically limited in the embodiments of the present disclosure.

In the manufacturing method of the fingerprint recognition sensor provided by the embodiment of the present disclosure, firstly, a base substrate which includes a conductive structure penetrating through the base substrate in the thickness direction can be provided, and then a photosensitive element can be formed on a first surface of the base substrate and a thin film transistor can be formed on a second surface of the base substrate opposite to the first surface. The thin film transistor, the base substrate and the photosensitive element are stacked in the thickness direction of the base substrate, and the photosensitive element can be connected with the thin film transistor through the conductive structure in the base substrate. In the embodiment of the invention, the thin film transistor and the photosensitive element can be respectively arranged on the two opposite surfaces of the base substrate, and they can be electrically connected through the conductive structure in the base substrate to realize the control of the photosensitive element. Therefore, when the thin film transistor is arranged, the arrangement space of the photosensitive element does not need to be compressed, so that the effective photosensitive area of the photosensitive element can be increased, thereby enhancing the photocurrent signal generated by the fingerprint recognition sensor and improving the accuracy of fingerprint recognition.

An embodiment of the invention further discloses a display device, which includes the fingerprint recognition sensor described above.

In the embodiment of the present disclosure, the fingerprint recognition sensor in the display device can include a base substrate, a thin film transistor and a photosensitive element, and the thin film transistor, the base substrate and the photosensitive element are stacked in the thickness direction of the base substrate. The base substrate includes a conductive structure penetrating through the base substrate in the thickness direction of the base substrate, and the photosensitive element can be connected with the thin film transistor through the conductive structure in the base substrate. In the embodiment of the present disclosure, the thin film transistor, the base substrate and the photosensitive element are stacked in the thickness direction of the base substrate, that is, the thin film transistor and the photosensitive element can be respectively arranged on two opposite surfaces of the base substrate, and they can be electrically connected through the conductive structure in the base substrate to realize the control of the photosensitive element. Therefore, when the thin film transistor is arranged, the arrangement space of the photosensitive element does not need to be compressed, so that the effective photosensitive area of the photosensitive element can be increased, thereby enhancing the photocurrent signal generated by the fingerprint recognition sensor and improving the accuracy of fingerprint recognition For convenience of description, all the aforementioned method embodiments are expressed as a series of action combinations, but those skilled in the art should know that the present disclosure is not limited by the described action sequence, because according to the present disclosure, some steps can be performed in other sequences or at the same time. Secondly, those skilled in the art should also know that the embodiments described in the specification are all preferred embodiments, and the actions and modules involved are not all necessary for the present disclosure.

(1) The accompanying drawings related to the embodiment(s) of the present disclosure involve only the structure(s) in connection with the embodiment(s) of the present disclosure, and other structure(s) can be referred to common design(s).

(2) In case of no conflict, features in the same embodiment or in different embodiments of the present disclosure can be combined with each other.

What have been described above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be determined based on the protection scope of the claims.

What is claimed is:

1. A fingerprint recognition sensor, comprising:
a base substrate;
a thin film transistor, located at a first side of the base substrate; and
a photosensitive element, located at a second side of the base substrate away from the thin film transistor,
wherein the first side and the second side are two opposite sides in a thickness direction perpendicular to the base substrate, the base substrate comprises a conductive structure penetrating through the base substrate in the thickness direction perpendicular to the base substrate, and the photosensitive element is connected with the thin film transistor through the conductive structure.

2. The fingerprint recognition sensor according to claim 1, wherein the conductive structure comprises a first conductive sub-structure and a second conductive sub-structure which are spaced apart from each other, and both the first conductive sub-structure and the second conductive sub-structure penetrate through the base substrate in the thickness direction of the base substrate; and
the photosensitive element comprises: a first electrode on a first surface of the base substrate; a photosensitive layer located at a side of the first electrode away from the base substrate; and a second electrode located at a side of the photosensitive layer away from the first electrode, wherein the first electrode is connected with the first conductive sub-structure, and the second electrode is configured to be electrically connected with the second conductive sub-structure.

3. The fingerprint recognition sensor according to claim 2, wherein the thin film transistor comprises an active layer, and an orthographic projection of the photosensitive layer on the base substrate overlaps with an orthographic projection of the active layer on the base substrate.

4. The fingerprint recognition sensor according to claim 3, wherein the orthographic projection of the photosensitive layer on the base substrate covers the orthographic projection of the active layer on the base substrate.

5. The fingerprint recognition sensor according to claim 2, wherein the photosensitive element further comprises:
a protective layer, covering the first electrode, the photosensitive layer, the second electrode and the first surface of the base substrate; and
a first overlapping electrode, located at a side of the protective layer away from the photosensitive layer,
wherein the protective layer comprises a first via hole and a second via hole, the first overlapping electrode is connected with the second electrode through the first via hole in the protective layer, and the first overlapping electrode is connected with the second conductive sub-structure through the second via hole in the protective layer.

6. The fingerprint recognition sensor according to claim 5, further comprising:
a third electrode, on a second surface of the base substrate opposite to the first surface and connected with the second conductive sub-structure,
wherein the third electrode is configured to input an operating voltage to the photosensitive element through the second conductive sub-structure and the first overlapping electrode.

7. The fingerprint recognition sensor according to claim 5, wherein a material of the first overlapping electrode is a transparent electrode material.

8. The fingerprint recognition sensor according to claim 3, wherein the thin film transistor further comprises:
a gate electrode, on a surface of the base substrate away from the photosensitive element; a gate insulating layer, located at a side of the gate electrode away from the base substrate and covering the gate electrode; and a source electrode, and a drain electrode,
wherein the active layer is located at a side of the gate insulating layer away from the gate electrode, the source electrode and the drain electrode are located at a side of the gate insulating layer away from the active layer, the source electrode and the drain electrode are respectively connected with the active layer, the gate insulating layer comprises a third via hole, the source electrode or the drain electrode is connected with the first conductive sub-structure in the base substrate through the third via hole in the gate insulating layer.

9. The fingerprint recognition sensor according to claim 8, further comprising:
a passivation layer, located at a side of the source electrode and the drain electrode away from the active layer, and covering the source electrode, the drain electrode, the active layer and the gate insulating layer.

10. A manufacturing method of a fingerprint recognition sensor, comprising:
providing a base substrate comprising a conductive structure penetrating through the base substrate in a thickness direction perpendicular to the base substrate;
forming a thin film transistor at a first side of the base substrate; and
forming a photosensitive element at a second side of the base substrate away from the thin film transistor,
wherein the first side and the second side are two opposite sides in a thickness direction perpendicular to the base substrate, and the photosensitive element is connected with the thin film transistor through the conductive structure.

11. The manufacturing method according to claim 10, wherein the conductive structure comprises a first conductive sub-structure and a second conductive sub-structure which are spaced apart from each other, and both the first conductive sub-structure and the second conductive sub-structure penetrate through the base substrate in the thickness direction of the base substrate; and
forming the photosensitive element on the side of the base substrate away from the thin film transistor comprises:
forming a first electrode on a first surface of the base substrate;
forming a photosensitive layer at a side of the first electrode away from the base substrate; and
forming a second electrode at a side of the photosensitive layer away from the first electrode,
wherein the first electrode is connected with the first conductive sub-structure, and the second electrode is configured to be electrically connected with the second conductive sub-structure.

12. The manufacturing method according to claim 11, wherein forming the photosensitive element on the side of the base substrate away from the thin film transistor further comprises:

forming a protective layer at a side of the second electrode away from the photosensitive layer, the protective layer covering the first electrode, the photosensitive layer, the second electrode and the first surface of the base substrate; and forming a first overlapping electrode at a side of the protective layer away from the photosensitive layer, wherein the protective layer comprises a first via hole and a second via hole, the first overlapping electrode is connected with the second electrode through the first via hole in the protective layer, and the first overlapping electrode is connected with the second conductive sub-structure through the second via hole in the protective layer.

13. The manufacturing method according to claim 12, further comprising:

forming a third electrode on a second surface of the base substrate opposite to the first surface, wherein the third electrode is connected with the second conductive sub-structure, and the third electrode is configured to input an operating voltage to the photosensitive element through the second conductive sub-structure and the first overlapping electrode.

14. The manufacturing method according to claim 11, wherein forming the thin film transistor on the side of the base substrate comprises:

forming a gate electrode at a side of the base substrate;

forming a gate insulating layer at a side of the gate electrode away from the base substrate, the gate insulating layer covering the gate electrode;

forming an active layer at a side of the gate insulating layer away from the gate electrode; and forming a source electrode and a drain electrode at a side of the active layer away from the gate insulating layer, wherein the source electrode and the drain electrode are respectively connected with the active layer, the gate insulating layer comprises a third via hole, the source electrode or the drain electrode is connected with the first conductive sub-structure in the base substrate through the third via hole in the gate insulating layer.

15. The manufacturing method according to claim 14, wherein an orthographic projection of the photosensitive layer on the base substrate overlaps with an orthographic projection of the active layer on the base substrate.

16. The manufacturing method according to claim 15, wherein the orthographic projection of the photosensitive layer on the base substrate covers the orthographic projection of the active layer on the base substrate.

17. The manufacturing method according to claim 14, further comprising:

forming a passivation layer at a side of the source electrode and the drain electrode away from the active layer, wherein the passivation layer covers the source electrode, the drain electrode, the active layer and the gate insulating layer.

18. A display device, comprising the fingerprint recognition sensor according to claim 1.

19. The fingerprint recognition sensor according to claim 3, wherein the photosensitive element further comprises:

a protective layer, covering the first electrode, the photosensitive layer, the second electrode and the first surface of the base substrate; and a first overlapping electrode, at a side of the protective layer away from the photosensitive layer, wherein the protective layer comprises a first via hole and a second via hole, the first overlapping electrode is connected with the second electrode through the first via hole in the protective layer, and the first overlapping electrode is connected with the second conductive sub-structure through the second via hole in the protective layer.

* * * * *